US012614507B2

(12) United States Patent
Li et al.

(10) Patent No.: US 12,614,507 B2
(45) Date of Patent: Apr. 28, 2026

(54) LED DISPLAY CONTAINING LEDS EMITTING INVISIBLE LIGHT

(71) Applicant: SiliconCore Technology, Inc., Milpitas, CA (US)

(72) Inventors: Eric Li, Milpitas, CA (US); Yi Zhang, Milpitas, CA (US); Shang-Kuan Tang, Milpitas, CA (US); Yun Hsiang Tsao, Milpitas, CA (US); Daniel Reetz, Milpitas, CA (US); Jim Wickenhiser, Milpitas, CA (US); Johanna Ocampo, Milpitas, CA (US)

(73) Assignee: SiliconCore Technology, Inc., Milpitas, CA (US)

( * ) Notice: Subject to any disclaimer, the term of this patent is extended or adjusted under 35 U.S.C. 154(b) by 0 days.

(21) Appl. No.: 18/957,481

(22) Filed: Nov. 22, 2024

(65) Prior Publication Data

US 2025/0166557 A1     May 22, 2025

Related U.S. Application Data

(60) Provisional application No. 63/602,602, filed on Nov. 25, 2023, provisional application No. 63/602,500, filed on Nov. 24, 2023, provisional application No. 63/601,908, filed on Nov. 22, 2023.

(51) Int. Cl.
| | |
|---|---|
| *G09G 3/32* | (2016.01) |
| *G06K 19/06* | (2006.01) |
| *G09G 3/20* | (2006.01) |
| *H01L 25/075* | (2006.01) |
| *H01L 25/16* | (2023.01) |

(52) U.S. Cl.
CPC .......... *G09G 3/32* (2013.01); *G06K 19/0614* (2013.01); *G09G 3/2096* (2013.01); *H01L 25/0753* (2013.01); *H01L 25/167* (2013.01); *G09G 2300/0452* (2013.01); *G09G 2320/0673* (2013.01)

(58) Field of Classification Search
None
See application file for complete search history.

(56) References Cited

U.S. PATENT DOCUMENTS

| | | | | | |
|---|---|---|---|---|---|
| 4,146,880 | A | * | 3/1979 | Arizabalaga | .......... G06F 3/0386 |
| | | | | | 345/156 |
| 6,570,584 | B1 | * | 5/2003 | Cok | ..................... G09G 3/3225 |
| | | | | | 348/E9.024 |
| 8,531,308 | B2 | * | 9/2013 | Dickie | .................... G09F 21/02 |
| | | | | | 340/972 |

(Continued)

*Primary Examiner* — Patrick N Edouard
*Assistant Examiner* — Peijie Shen
(74) *Attorney, Agent, or Firm* — NKL Law; Allen Xue

(57)     ABSTRACT

A light emitting diode (LED) display system contains an LED array driven by an LED driver. The LED array contains a plurality of LEDs configured to emit invisible lights and a plurality of color LEDs configured to emit visible lights. The two types of LED can be packaged into a hybrid LED unit. LEDs emitting invisible lights can be IR LEDs and/or UV LEDs, such that an exemplary hybrid LED unit may contain one or more R, G, and B LEDs and one or more IR LED and UV LED. The LED array can be arranged in a common cathode configuration or a common anode configuration. Using an infrared code reader, one may pinpoint the locations of IR LEDs in the LED array.

11 Claims, 11 Drawing Sheets

(56) References Cited

U.S. PATENT DOCUMENTS

| | | | | |
|---|---|---|---|---|
| 2006/0114172 A1* | 6/2006 | Shivji | | G09G 3/32 |
| | | | | 345/1.1 |
| 2006/0132451 A1* | 6/2006 | Salters | | G06F 3/03547 |
| | | | | 345/173 |
| 2007/0018915 A1* | 1/2007 | Tang | | H10K 59/351 |
| | | | | 345/76 |
| 2012/0176298 A1* | 7/2012 | Suh | | G09G 3/3208 |
| | | | | 345/82 |
| 2013/0002846 A1* | 1/2013 | De Bruijn | | G06V 40/193 |
| | | | | 348/78 |
| 2013/0016072 A1* | 1/2013 | Taylor | | G06F 3/033 |
| | | | | 345/179 |
| 2015/0201184 A1* | 7/2015 | Xu | | G09G 3/003 |
| | | | | 348/59 |
| 2016/0110025 A1* | 4/2016 | Hossu | | G06V 10/141 |
| | | | | 382/124 |
| 2017/0084223 A1* | 3/2017 | Li | | G09G 5/393 |
| 2017/0084253 A1* | 3/2017 | Li | | G09G 3/32 |
| 2017/0365588 A1* | 12/2017 | Chen | | H10D 86/40 |
| 2018/0018917 A1* | 1/2018 | Yoo | | G06F 3/147 |
| 2018/0211088 A1* | 7/2018 | Cho | | H10K 59/1216 |
| 2018/0239445 A1* | 8/2018 | Barel | | G06F 3/04162 |
| 2019/0041983 A1* | 2/2019 | Hicks | | G06F 3/013 |
| 2019/0064953 A1* | 2/2019 | McCoy | | G06F 3/017 |
| 2019/0102896 A1* | 4/2019 | Ding | | G09G 3/00 |
| 2019/0295457 A1* | 9/2019 | Li | | G09G 3/32 |
| 2021/0036046 A1* | 2/2021 | Kwon | | H10F 39/18 |
| 2021/0202780 A1* | 7/2021 | Tseng | | G01S 17/08 |
| 2021/0357608 A1* | 11/2021 | Tang | | G09G 3/3233 |
| 2022/0069025 A1* | 3/2022 | Yamazaki | | H10K 59/30 |
| 2022/0285457 A1* | 9/2022 | Lee | | H10K 59/122 |
| 2022/0401658 A1* | 12/2022 | Klemm | | A61M 5/31568 |
| 2023/0103249 A1* | 3/2023 | Kawakami | | H10K 85/6572 |
| | | | | 257/40 |
| 2023/0266854 A1* | 8/2023 | Yoo | | G06F 3/03545 |
| | | | | 345/174 |
| 2024/0027819 A1* | 1/2024 | Park | | H04M 1/0266 |
| 2024/0315084 A1* | 9/2024 | Sasagawa | | H10K 59/352 |
| 2024/0381687 A1* | 11/2024 | Ohsawa | | H10K 59/122 |
| 2024/0389393 A1* | 11/2024 | Yamazaki | | H05B 33/02 |

* cited by examiner

RGB LED Unit

RGB + IR LED Unit

LED DISPLAY CONTAINING LEDS EMITTING INVISIBLE LIGHT

CROSS-REFERENCE TO RELATED APPLICATIONS

This application claims the benefit of priority under 35 U.S.C. § 119 to U.S. Provisional Application No. 63/601,908, filed Nov. 22, 2023, U.S. Provisional Application No. 63/602,500, filed Nov. 24, 2023, and U.S. Provisional Application No. 63/602,602, filed Nov. 25, 2023, the entire contents of which are incorporated herein by reference.

BACKGROUND

1. Field of Technology

The present disclosure relates to a light emitting diode (LED) display having both color LEDs and LEDs that emit invisible lights/radiations.

2. Description of Related Art

A conventional LED display is typically composed of LED pixels that contain one or more color LEDs, i.e., R, G, or B LEDs. Such an LED display emits only visible lights. There are applications (e.g., virtual reality simulations) that require the LED display to emit invisible lights, such as infrared (IR) light or ultraviolet (UV) light. The invisible light can be detected using optoelectrical sensors. For example, an infrared code reader may detect the IR light emitting from IR LEDs.

New applications devices and methods are developed using the LED display that emits both visible lights and invisible lights.

SUMMARY

According to an embodiment of the current disclosure, a light emitting diode (LED) display system contains an LED array and an LED driver that drives the LED array. The LED array contains a plurality of first LEDs configured to emit invisible lights, and a plurality of color LEDs configured to emit visible lights.

Another embodiment of the LED display system of the current disclosure contains a plurality of the LED arrays and a plurality of the LED drivers, and one or more receivers. The receiver contains a circuit configured to decode data packets received and send commands and data to the plurality of the LED drivers.

In a further embodiment, the LED display system contains a plurality of the receivers connected in series via GPHY links while each receiver is further connected to one or more LED drivers.

The LED display system may also contain a transmitter having a memory and a pixel mapping table. The mapping table is configured to receive a data packet from a data source and assigns to the data packet a set of field information that contains a unique address for an LED in the LED array that the data packet is sent to.

According to a further embodiment of the current disclosure, the LED array may be composed of a plurality of hybrid LED units while each hybrid LED unit contains one or more of the first LEDs and one or more of the color LEDs.

One exemplary hybrid LED unit contains an R LED, a G LED, a B LED, and an IR LED. Another exemplary hybrid LED unit contains an R LED, a G LED, a B LED, an IR LED, and a UV LED.

In an additional embodiment, the LED array contains both hybrid LED units and color LED units. Each color LED unit contains one or more R, G, B LEDs.

According to one aspect of the disclosure, in the LED array, a ratio of a number of the plurality of the hybrid LED units and a number of the plurality of color LED units ranges from 1:20 to 20:1.

In still another embodiment of the LED display system, the LED array contains a plurality of IR LEDs emitting IR lights. The LED display system also has an infrared code reader signally connected to the LED array and configured to detect IR light emission from the plurality of IR LEDs.

One may pinpoint the position of the IR LEDs in the LED array according to a method that contains the steps of causing one or more of the plurality of IR LEDs to emit IR light; detecting the IR light using the IR code reader; identifying coordinates of the one or more of the plurality of IR LEDs that emit IR light; transmitting the identified coordinates to the LED display; and causing one or more color LEDs at the identified coordinates to lit, thereby showing the location of the one or more of the plurality of IR LEDs that emit IR light.

BRIEF DESCRIPTION OF THE DRAWINGS

Advantages of embodiments of the present invention will be apparent from the following detailed description of the exemplary embodiments thereof, which description should be considered in conjunction with the following drawings.

DETAILED DESCRIPTION OF EXEMPLARY EMBODIMENTS

Figure 1:
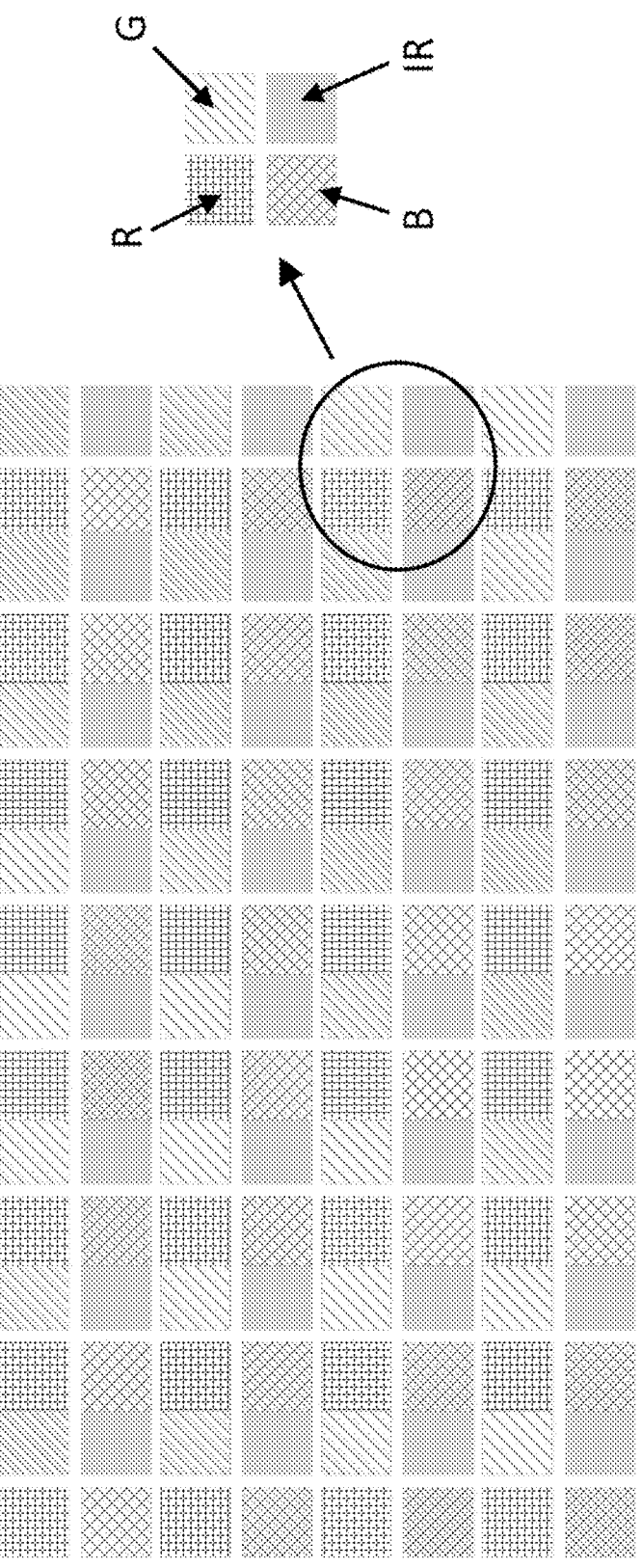
FIG. 1 is a schematic illustration of an exemplary LED array composed of RGB+IR LED units

Aspects of the invention are disclosed in the following description and related drawings directed to specific embodiments of the invention. Alternate embodiments may be devised without departing from the spirit or the scope of the invention. Additionally, well-known elements of exemplary embodiments of the invention will not be described in detail or will be omitted so as not to obscure the relevant details of the invention. Further, to facilitate an understanding of the description discussion of several terms used herein follows.

As used herein, the word "exemplary" means "serving as an example, instance or illustration." The embodiments described herein are not limiting, but rather are exemplary only. It should be understood that the embodiments described are not necessarily to be construed as preferred or advantageous over other embodiments. Moreover, the terms "embodiments of the invention", "embodiments" or "invention" do not require that all embodiments of the invention include the discussed feature, advantage or mode of operation.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

According to various exemplary implementations of the current disclosure, an LED display contains color LEDs that emit visible lights as well as LEDs that emit invisible lights (hereinafter "invisible LEDs"). Each color LED or each invisible LED may be one stand-alone light emitting unit separated from other LEDs. Alternatively, the display may contain hybrid LED units. Used herein, a hybrid LED unit is a light emitting unit having one or more color LEDs, i.e., R, G, B LEDs, and one or more invisible LEDs, e.g., IR LED or UV LED. Each hybrid LED unit may be packaged as one single light emitting unit for easy installation and referred to as a pixel in the LED display.

The composition of the hybrid LED unit can be tailored to suit specific applications. For example, a hybrid LED unit may contain all three RGB subpixels and one IR LED as the IR subpixel, i.e., an RGB+IR LED unit. Alternatively, a hybrid LED unit may contain one R subpixel and one UV subpixel, i.e., a R+UV LED unit. Still, a hybrid LED unit may contain R and G subpixels, one IR subpixel, and one UV subpixel, i.e., an RG+IR+UV LED unit.

The ratio of the number of invisible LEDs and the number of color LEDs, which reflects the density of the invisible LEDs, is adjustable according to the application requirements.

Figure 2:
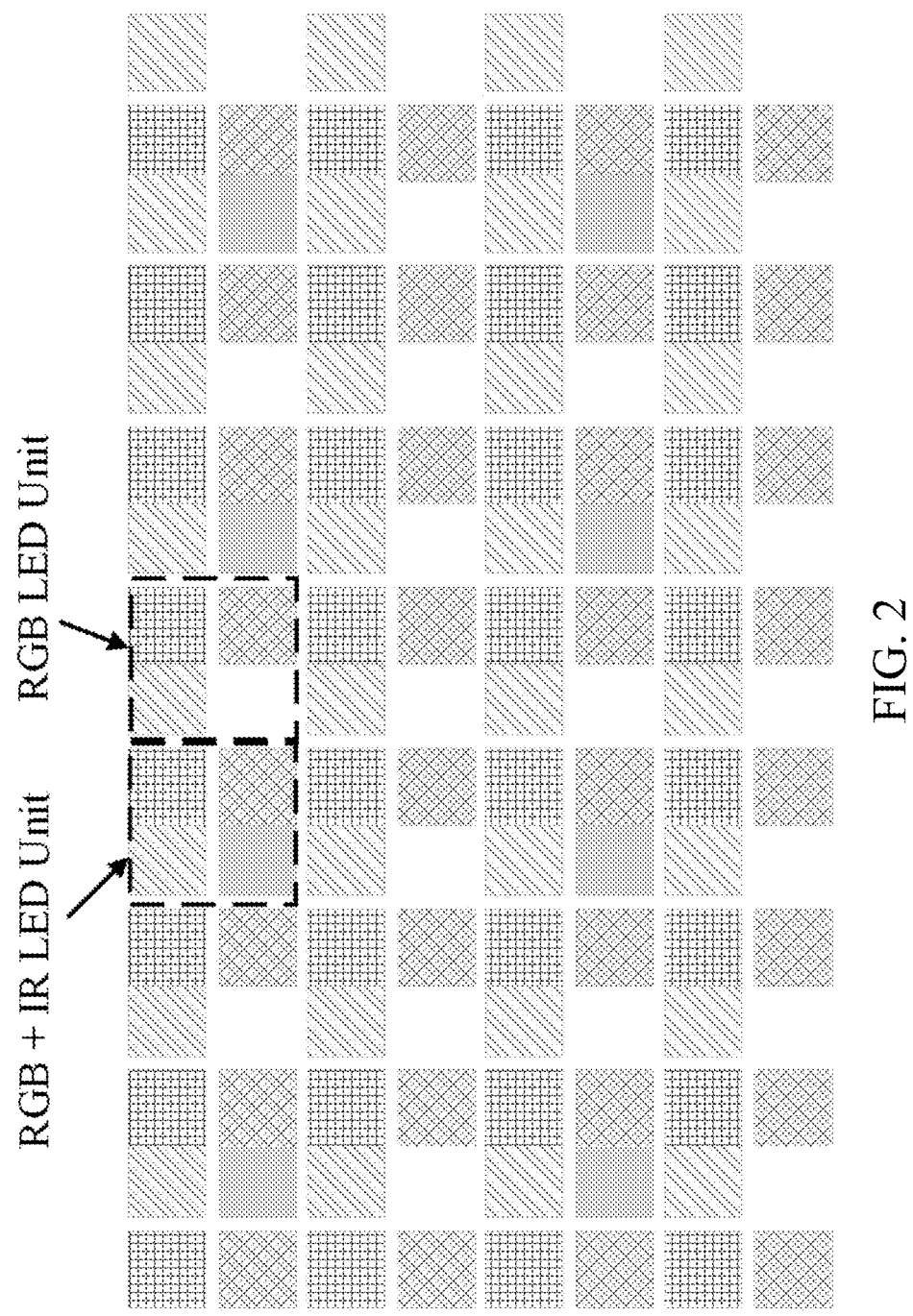
FIG. 2 is a schematic illustration of another exemplary LED array having both RGB+IR LED units and RGB LED units.

FIGS. 1 and 2 respectively show the configurations of two different LED arrays representing two different LED displays. FIG. 1 shows an array of hybrid LED units in which each hybrid LED unit contains one IR LED. Specifically, the entire array is made of hybrid LED units each having four subpixels—R, G, B, and IR LEDs, i.e., RGB+IR LED units. The R, G, and B LEDs emit lights that form images visible to naked eyes while the IR LEDs emit IR lights only detectable using optoelectrical sensors.

The density of the invisible LEDs can be changed by combining color LED units with hybrid LED units in the LED array. According to FIG. 2, the LED array contains RGB LED units as well as RGB+IR LED units in equal numbers. Accordingly, one half of the pixels in the LED array are RGB+IR LED units while the other half of the pixels are RGB LED units. By increasing the number of RGB+IR LED units and decreasing the number of RGB LED units, one may increase the density of the IR LEDs in the LED array, and vice versa. For example, the ratio of the number of RGB+IR LED units to the number of RGB LEDs unit can be any number based on the application requirement, e.g., 1:20 to 20:1, 1:10 to 10:1, including 6:1, 4:1, 2:1, 1:1, 1:2, 1:4, and 1:6, and any numbers therebetween.

Figure 3:
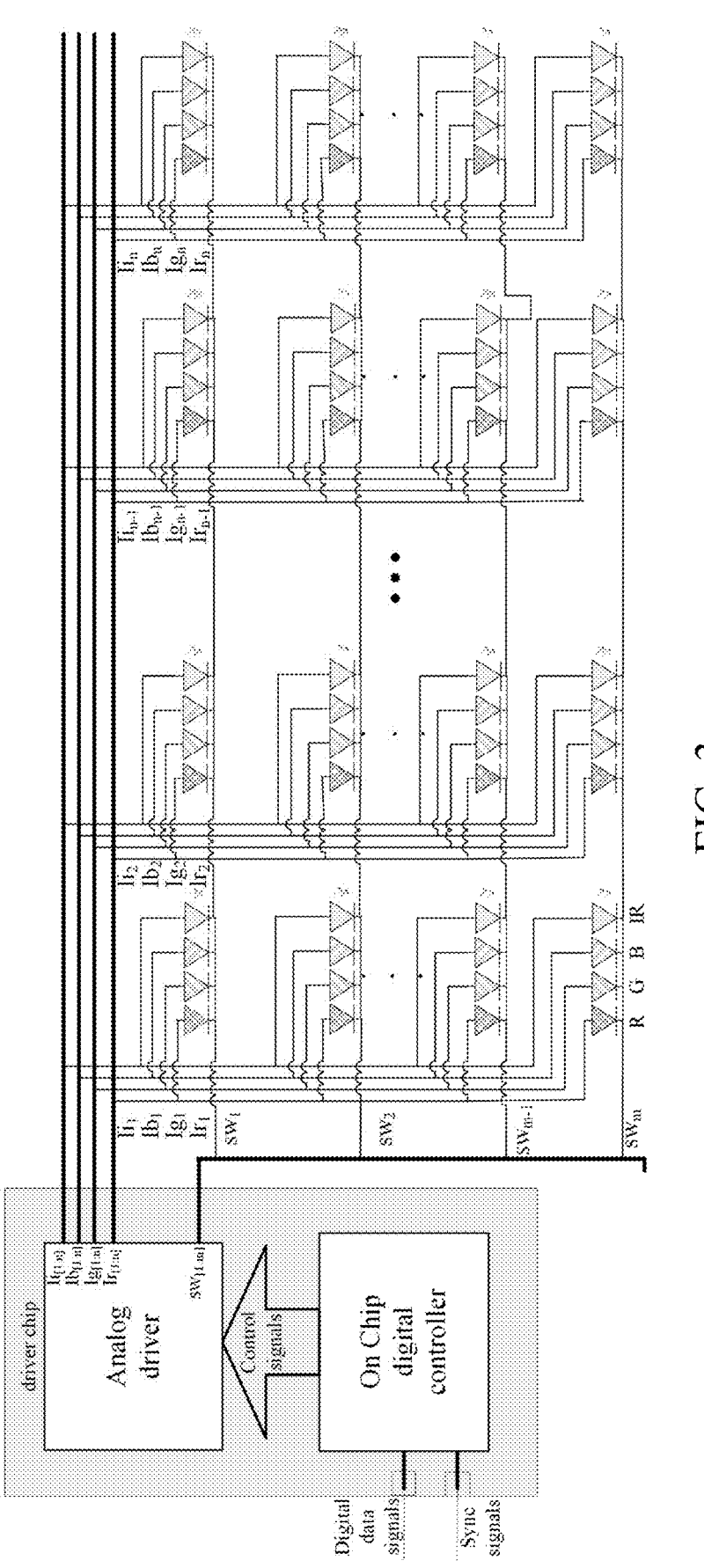
FIG. 3 is a schematic illustration of the LED array arranged in a common cathode configuration and having scan switches disposed on the driver chip.
Figure 4:
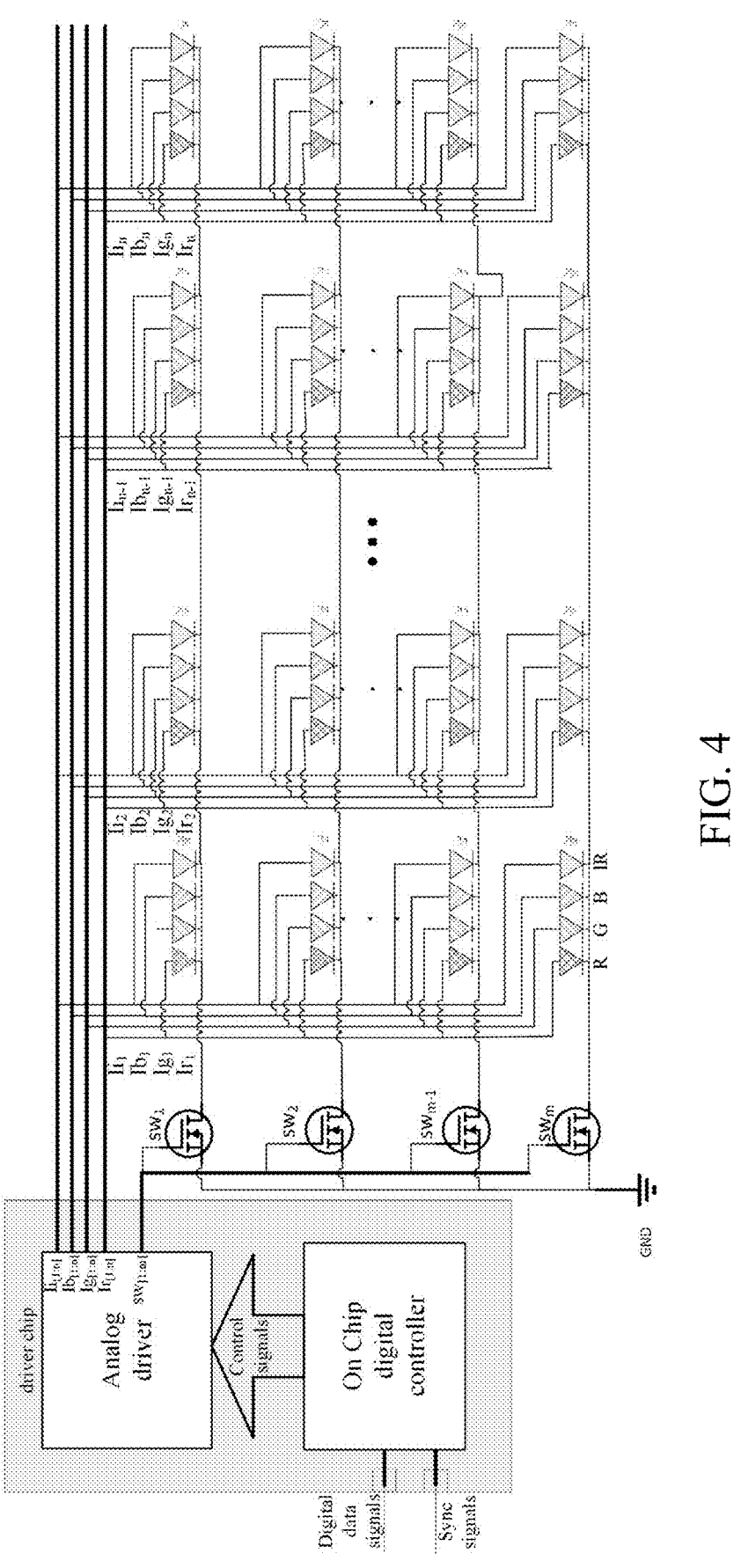
FIG. 4 is a variation of the embodiment shown in FIG. 3, in which scan switches do not reside on the driver chip.
Figure 5:
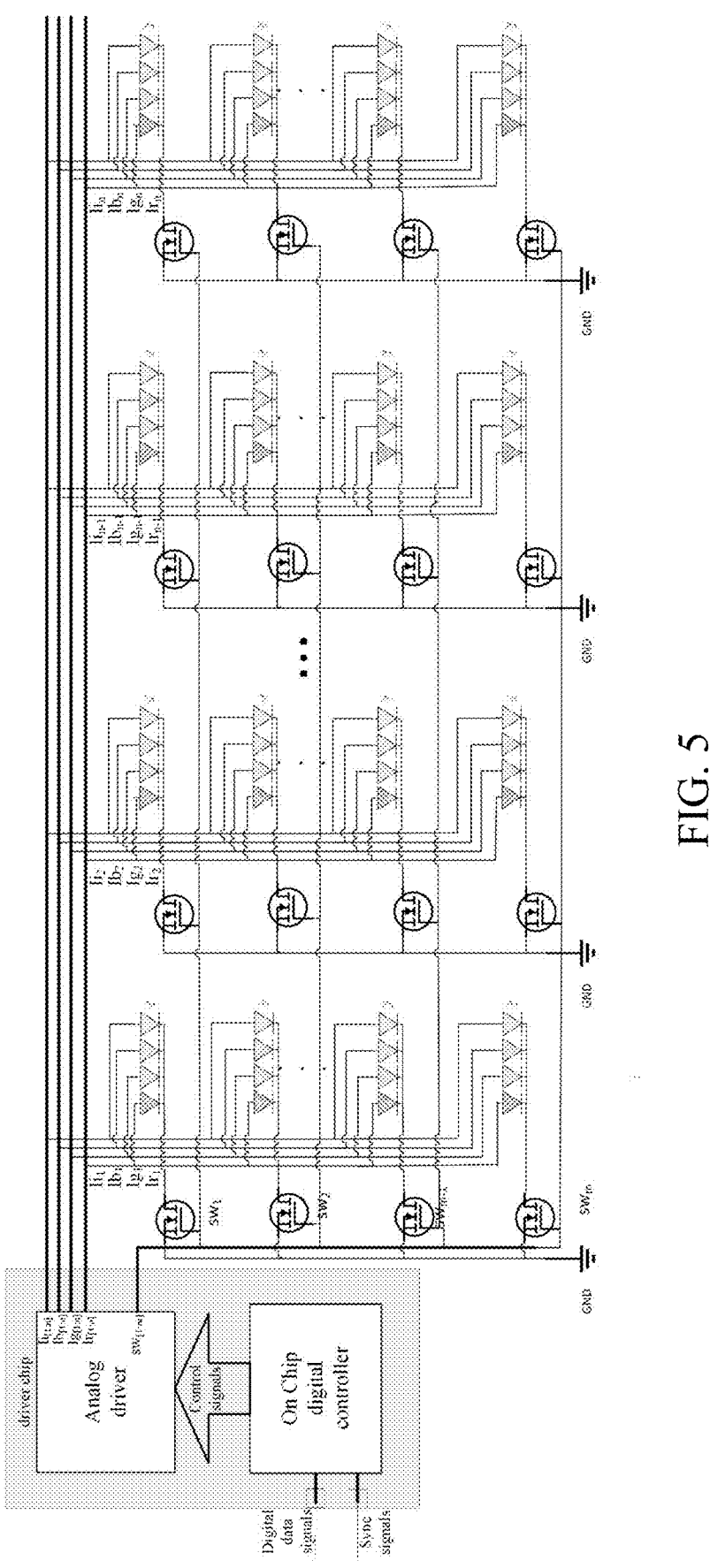
FIG. 5 is a further variation of the embodiments shown in FIG. 3 and FIG. 4, in which every RGB+IR LED unit has its own designated switch.

FIGS. 3-5 illustrate an LED display having a m×n array of RGB+IR LED units connected in a common cathode configuration. The cathodes of the RGB+IR LED units are connected to a driver chip through a plurality of scan switches—SW1 to SWm. The driver chip contains an analog driver connected to a digital controller. The digital controller receives and processes data signals, sync signals, and sends control signals to the analog driver, which in turn drives the LED array.

In all embodiments illustrated in FIGS. 3-5, the anode of each IR, R, G, and B LED is electrically connected to one current source in the analog driver. Each current source supplies a driving current to the same type of LEDs across the n columns of RGB+IR LED units, i.e., $Ii[1: n]$ for IR LEDs, $Ib[1: n]$ for B LEDs, $Ig[1: n]$ for G LEDs, and $Ir[1: n]$ for R LEDs.

Scan switches SW1 to SWm can be either disposed on the driver chip, as illustrated in FIG. 3, or off the driver chip, such as in the embodiments depicted in FIGS. 4 and 5. Further, in FIGS. 3 and 4, one row of RGB+IR LED unit is controlled by one switch installed on one common cathode node. The embodiment of FIG. 5 shows that each RGB+IR LED unit is connected to its designated switch, which in turn is connected to a common cathode node.

Figure 6:
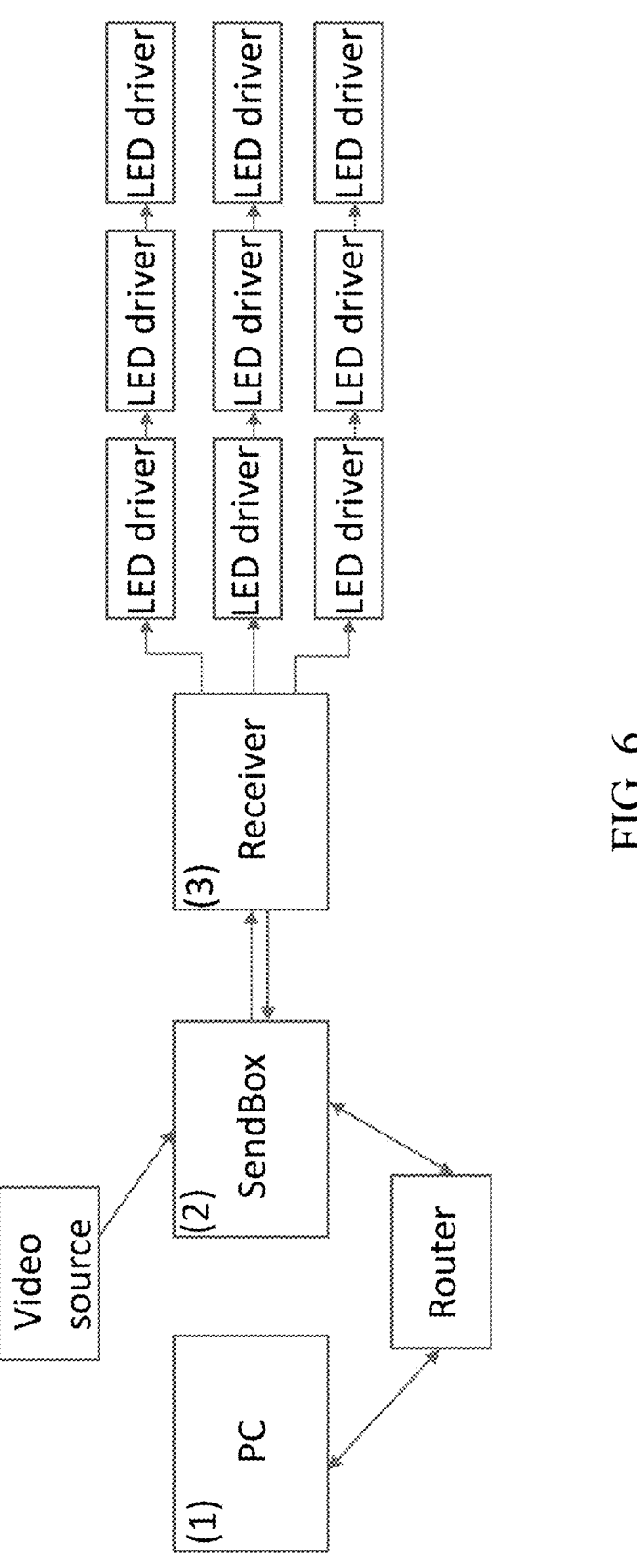
FIG. 6 is a schematic illustration of an LED display system of the current disclosure.

FIG. 6 shows how an exemplary LED display of the current disclosure operates. The system has a PC, a SendBox (transmitter), a receiver chip (receiver), and a plurality of LED drivers. Each LED driver connected to an LED array containing invisible LEDs, such as those depicted in FIGS. 1 and 2. The SendBox is a transmitter. The transmitter may have a memory and a pixel mapping table. The pixel mapping table receives a data packet from a data source (e.g., a video source) and assigns to the data packet a set of field information that contains a unique address for a LED pixel in the array of the LED pixels.

The LED manager control software is installed on the PC for controlling SendBox and the receiver chip. SendBox converts the video source and instructions from PC and sends them in the form of data packet to the receiver chip, e.g., via the internet cable. The receiver chip has circuitry that decode the data packets received and send commands and data to the plurality of LED drivers. The LED driver may be a driver chip that contains a digital controller and an analog driver, as shown in the driver chip in FIGS. 3-5. Each LED driver drives an LED array according to the data value received from receiver. The LED manger software on the PC and SendBox may communicate with each other via the wifi router or through a cable.

Figure 7:
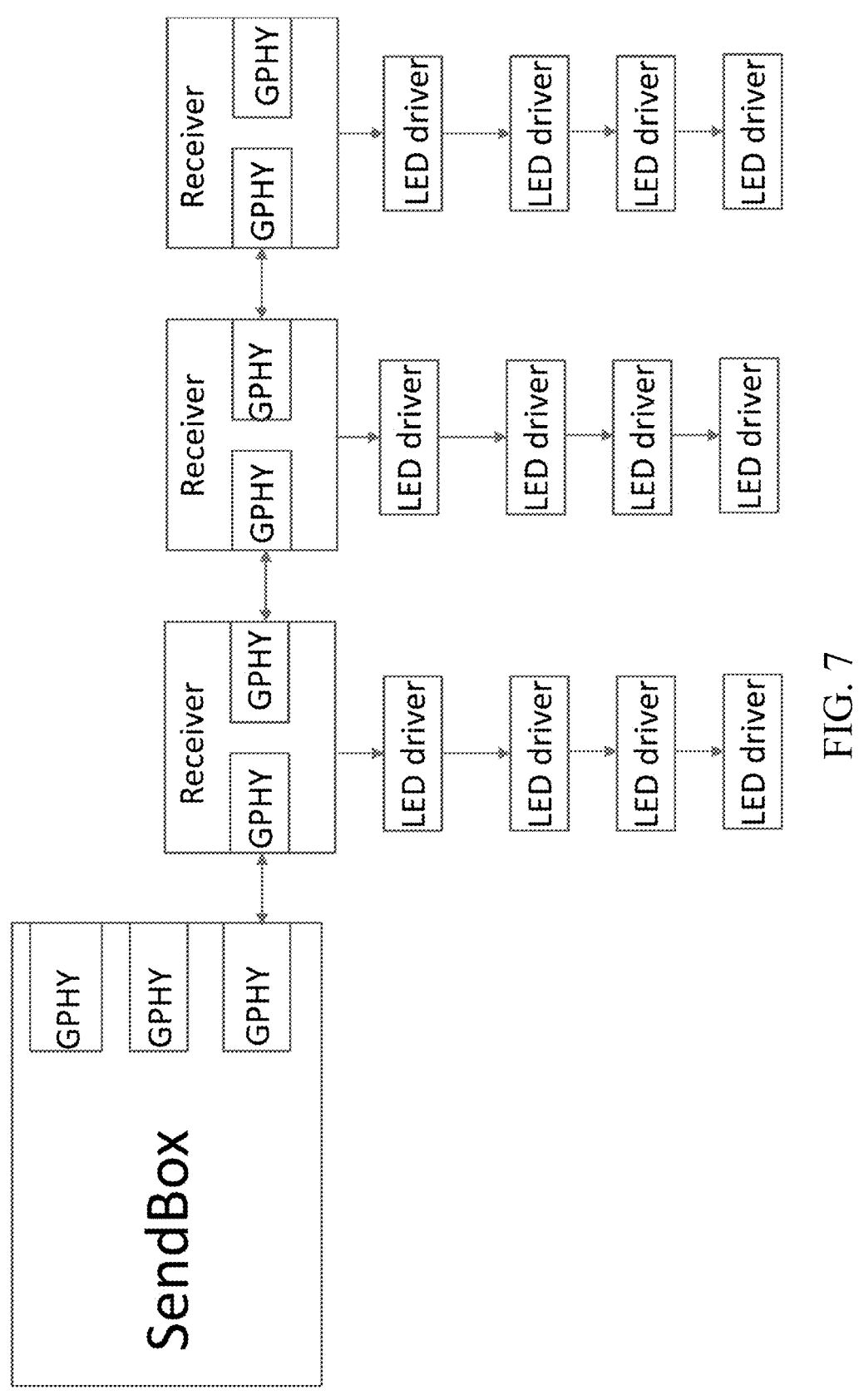
FIG. 7 is a variation of the embodiment shown in FIG. 6, in which receivers are connected via GPHY links.

FIG. 7 illustrates another embodiment of the LED display system of the current disclosure. It differs from the embodiment in FIG. 6 in that multiple receivers are connected in series using GPHY links, starting from the SendBox. In this configuration, additional receivers can be added using GPHY links, thereby accommodating more LED drivers and LED arrays, making the LED display more scalable.

Figure 8:
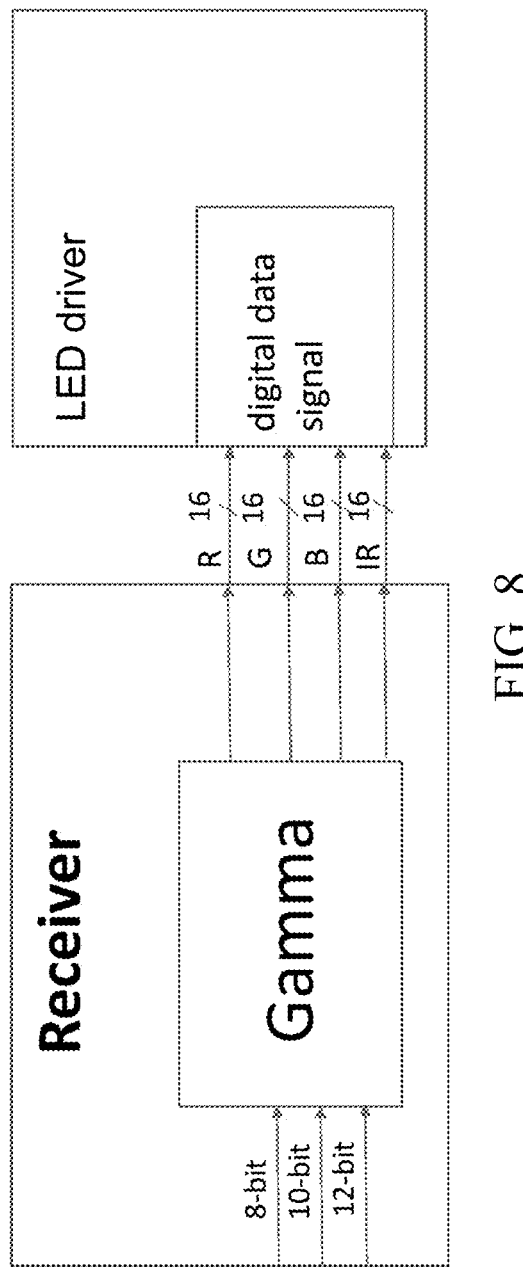
FIG. 8 is a schematic illustration showing the operation in the receiver.

FIG. 8 illustrates the operation in the receiver. It receives 8/10/12 bits video data, and after Gamma correction, converts the video data to 16-bit LED driver signals. The example shown in FIG. 8 is for driving an LED array composed of RGB+IR LED units, which uses 16 bits driver signals for each of R, G, B, and IR LEDs. Depending on the composition of the LED array, more or less driver signals may be required. For example, driver signals for UV LEDs can be added for driving an LED array having RGB+IR+UV LED units.

Figure 9:
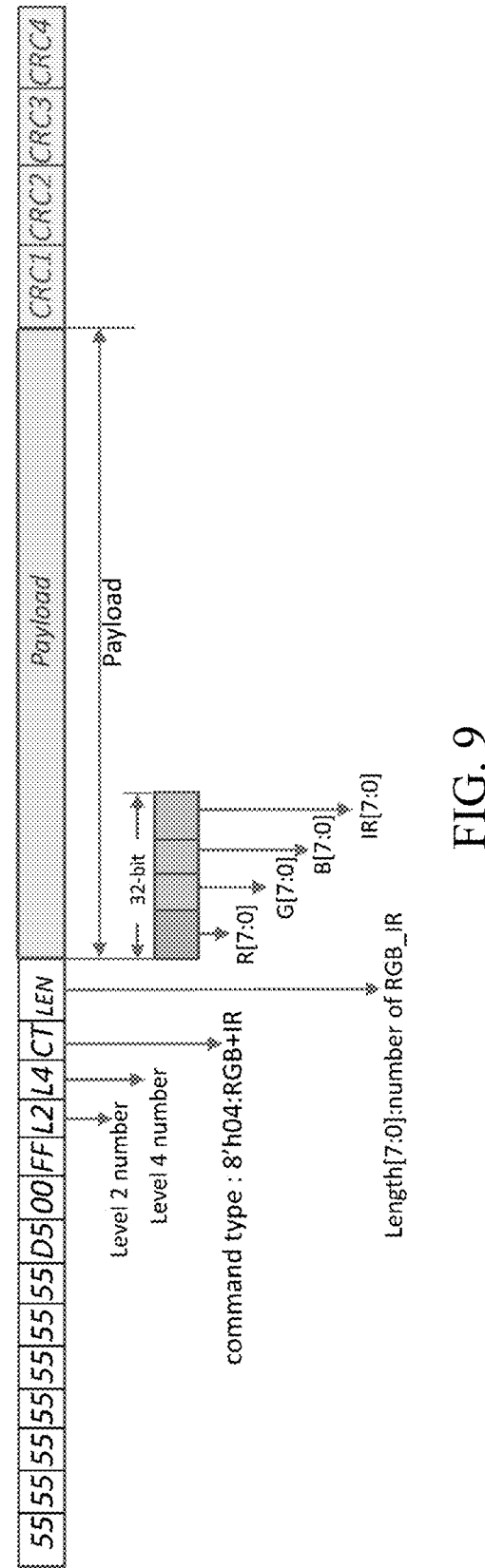
FIGS. 9, 10, and 11 show exemplary data packets transmitted from the transmitter to the receiver.
Figure 10:
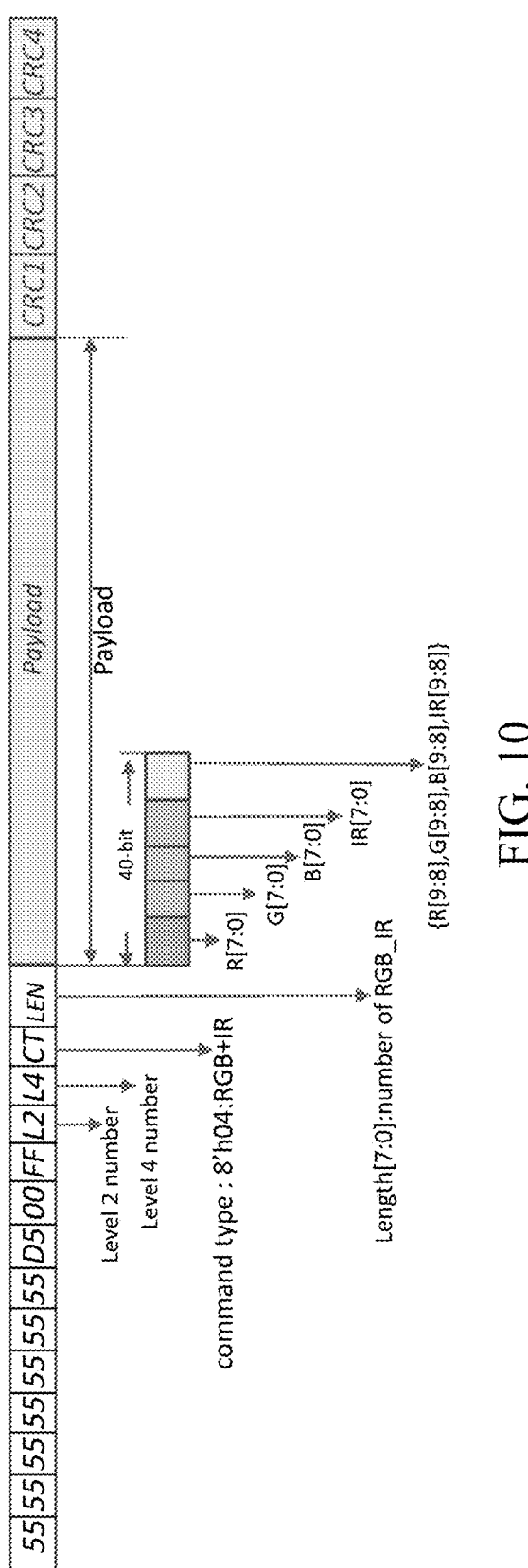
Figures 11, 12:
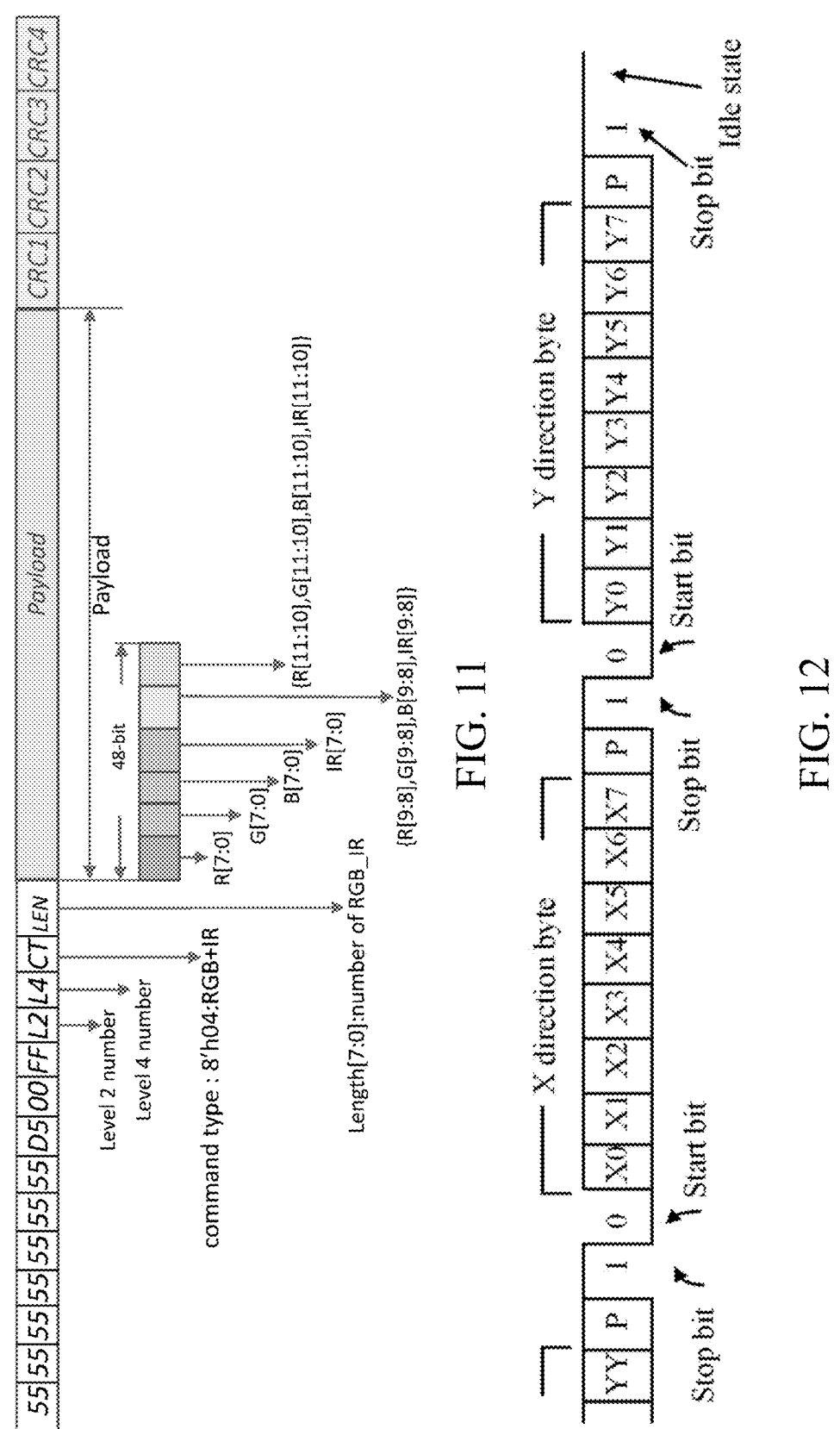
FIG. 12 illustrates the position signals from the IR code reader to the LED array, which contains a start bit and a stop bit delimiting the coordination byte.

FIGS. 9-11 show exemplary data packets being transmitted to the receiver from the SendBox. Payloads in FIG. 9-11 are 32 bits, 40 bits, and 48 bits, respectively.

The invisible LEDs may be used as position markers by showing their positions in an LED display. According to an embodiment of this disclosure, the LED display system includes an LED display and an infrared code reader signally connected to the LED display. Each IR LED in the LED display can broadcast its position on the display, e.g., in x- and y-coordinates, by emitting an IR light that signifies its location on the display. The code reader receives and decodes the IR light to pinpoint the position of the IR LED according to the emitted IR light and transmits the position to the LED display. In this way, the IR LED acts as a marker of its position on the LED display.

As an example, the IR light emitted from an IR LED contains a correction/start stop code, e.g., "XY, 255, 128", indicating the IR LED has an x-coordinate of 255 and a y-coordinate of 128, thereby pinpointing its location. Alternatively, the position signals from the IR code reader to the LED array contain a start bit and stop bit that delimited the location bytes, as shown in FIG. 12.

The infrared code reader has photodiode and lens that receive the IR light. It may also have photodiode amplifier or transimpedance amplifier at its tip to convert current signals from the photodiode to voltage signals. The voltage signals are then digitized to form a XY location code, which is used to identify the position of the IR LED emitting the signal. The position may be made visible by lighting the color LEDs in the hybrid LED unit containing the IR LED. Alternatively, the position of the LED pixel may be stored in a memory for further processing. The infrared code reader is connected to the LED display using Bluetooth, USB, or any other connection means available on the market.

Variations based on the current disclosure are numerous. For example, the LED array in FIGS. 4-6 are configured in a common cathode configuration, i.e., the cathodes of the LEDs in the same row are connected to a same scan line and the anode of the LEDs are connected to their respective current sources. In other embodiments, the LED array can be arranged in a common anode configuration, in which anodes of a plurality of LEDs of a same color in a same row are operatively connected to a power source via a switch while cathodes of the plurality of LEDs of the same color in a same column are tied to the output of a current driver circuit.

In another variation, the LED array only contains RGB+IR LED units or RGB+IR+UV LED units. When an application only requires single visible color of R, G, or B, the LED driver is configured to lit one type of LED of the selected color and to turn off LED of other colors.

Therefore, the above-described embodiments should be regarded as illustrative rather than restrictive. Accordingly, it should be appreciated that variations to those embodiments can be made by those skilled in the art without departing from the scope of the invention as defined by the following claims.

We claim:

1. A light emitting diode (LED) display system, comprising:
   an LED display comprising an LED array, wherein the LED array comprises a plurality of infrared (IR) LEDs configured to emit IR light and a plurality of color LEDs configured to emit visible light;
   an LED driver connected to the LED array and configured to drive the LED array; and
   an infrared code reader signally connected to the LED array and comprises a photodiode, and a photodiode amplifier or a transimpedance amplifier,
   wherein the photodiode is configured to convert IR light emitted from the plurality of IR LEDs to a current signal, and the photodiode amplifier or transimpedance amplifier is configured to convert the current signals from the photodiode to a voltage signal;
   wherein the infrared code reader is configured to digitize the voltage signal to form a XY location code identifying a coordinate for each of one or more of the plurality of IR LEDs that emits the IR light, and to transmit the identified coordinate to the LED display,
   wherein the LED display is configured to cause one or more color LEDs at the identified coordinates to lit, thereby showing the location of the one or more of the plurality of IR LEDs that emitted IR light.

2. The LED display system of claim 1, further comprising a plurality of the LED arrays and a plurality of the LED drivers, and a receiver, wherein the receiver contains a circuit configured to decode data packets received and send commands and data to the plurality of the LED drivers.

3. The LED display system of claim 2, comprising a plurality of the receivers connected in series via GPHY links, each receiver is further connected to one or more LED drivers.

4. The LED display system of claim 1, further comprising a transmitter having a memory and a pixel mapping table, wherein the pixel mapping table is configured to receive a data packet from a data source and assigns to the data packet a set of field information that contains a unique address for an LED in the LED array that the data packet is sent to.

5. The LED display system of claim 1, wherein the LED array comprises a plurality of hybrid LED units, each hybrid LED unit comprises one or more of the first LEDs and one or more of the color LEDs.

6. The LED display system of claim 5, wherein each hybrid LED unit contains an R LED, a G LED, a B LED, and an IR LED.

7. The LED display system of claim 5, wherein each hybrid LED unit contains an R LED, a G LED, a B LED, an IR LED, and a UV LED.

8. The LED display system of claim 5, wherein the LED array further comprising a plurality of color LED units, each color LED unit contains one or more LEDs selected from R LED, G LED, and B LED.

9. The LED display system of claim 8, wherein, in the LED array, a ratio of a number of the plurality of the hybrid LED units and a number of the plurality of color LED units ranges from 1:20 to 20:1.

10. A method to operate the LED display system of claim 1, comprising:
   causing one or more of the plurality of IR LEDs in the LED array to emit IR light;
   receiving the IR light and converting the IR light to the current signal using the IR code reader;

converting, using the photodiode amplifier or the transimpedance amplifier, the current signal to the voltage signal;

digitizing the voltage signal to form a XY location code;

identifying, for each of one or more of the plurality of IR LEDs that emits the IR light, a coordinate thereof; and transmitting the identified coordinates to the LED display.

11. The method of claim 10, wherein the infrared code reader is connected to the LED display using Bluetooth or USB.

\* \* \* \* \*